US008425741B2

(12) United States Patent
Proudfoot et al.

(10) Patent No.: US 8,425,741 B2
(45) Date of Patent: Apr. 23, 2013

(54) ION DEPOSITION APPARATUS HAVING ROTATABLE CAROUSEL FOR SUPPORTING A PLURALITY OF TARGETS

(75) Inventors: Gary Proudfoot, Oxford (GB); Christopher David George, Bristol (GB); Paulo Edurado Lima, Gwent (GB); Gordon Robert Green, Bristol (GB); Robert Kenneth Trowell, Bristol (GB)

(73) Assignee: Aviza Technology Limited, Newport, South Wales (GB)

( * ) Notice: Subject to any disclaimer, the term of this patent is extended or adjusted under 35 U.S.C. 154(b) by 748 days.

(21) Appl. No.: 12/309,464

(22) PCT Filed: Jul. 6, 2007

(86) PCT No.: PCT/GB2007/002537
§ 371 (c)(1),
(2), (4) Date: Dec. 4, 2009

(87) PCT Pub. No.: WO2008/009889
PCT Pub. Date: Jan. 24, 2008

(65) Prior Publication Data
US 2010/0084569 A1    Apr. 8, 2010

Related U.S. Application Data

(60) Provisional application No. 60/832,474, filed on Jul. 20, 2006.

(30) Foreign Application Priority Data

Jul. 21, 2006 (GB) .................................. 0614499.2

(51) Int. Cl.
*C25B 9/00* (2006.01)
*C25B 13/00* (2006.01)
*B05B 5/025* (2006.01)

(52) U.S. Cl.
USPC ............. 204/298.12; 204/298.28; 250/423 R; 118/620; 118/631

(58) Field of Classification Search ............. 250/440.11, 250/442.11, 425, 492.1, 492.3, 423 R; 118/730, 118/640, 624, 620, 631; 204/192.11, 298.04, 204/298.12, 298.28
See application file for complete search history.

(56) References Cited

U.S. PATENT DOCUMENTS 3,864,797 A    2/1975 Banks
4,232,244 A    11/1980 Fink et al.
(Continued)

FOREIGN PATENT DOCUMENTS

EP    0 360 608 A1    3/1990
EP    0 496 564 A1    7/1992
(Continued)

OTHER PUBLICATIONS

Great Britain Search Report for GB0614499.2 dated Nov. 22, 2006, 1 pg. claims searched.
(Continued)

*Primary Examiner* — Phillip A Johnston
*Assistant Examiner* — Brooke Purinton
(74) *Attorney, Agent, or Firm* — Volentine & Whitt, PLLC

(57) ABSTRACT

This invention relates to a broad beam ion deposition apparatus (100) including an ion source (101), a target (102), a tillable substrate table (103) and an auxiliary port (104). The target (102) is in the form of a carousel which carries a number of targets and the ion source (101) is configured to produce a substantially rectangular section beam (105).

37 Claims, 9 Drawing Sheets

U.S. PATENT DOCUMENTS

| | | | |
|---|---|---|---|
| 4,447,773 A | 5/1984 | Aston | |
| 4,857,800 A | 8/1989 | Ohkoshi et al. | |
| 4,987,346 A | 1/1991 | Katzschner et al. | |
| 4,992,665 A | 2/1991 | Mohl | |
| 5,036,252 A | 7/1991 | Lob | |
| 5,059,292 A * | 10/1991 | Collins et al. | 204/298.12 |
| 5,107,170 A | 4/1992 | Ishikawa et al. | |
| 5,296,122 A | 3/1994 | Katsube et al. | |
| 5,559,391 A * | 9/1996 | Valentian | 313/360.1 |
| 5,622,567 A * | 4/1997 | Kojima et al. | 118/726 |
| 5,786,039 A | 7/1998 | Brouquet | |
| 5,871,622 A | 2/1999 | Pinarbasi | |
| 5,874,367 A | 2/1999 | Dobson | |
| 5,924,277 A | 7/1999 | Beattie et al. | |
| 6,113,752 A * | 9/2000 | Hollstein | 204/192.12 |
| 6,214,698 B1 | 4/2001 | Liaw et al. | |
| 6,224,718 B1 | 5/2001 | Meyer | |
| 6,238,531 B1 * | 5/2001 | Pinarbasi | 204/298.04 |
| 6,246,162 B1 | 6/2001 | Kahn et al. | |
| 6,339,206 B1 | 1/2002 | Johnson | |
| 6,346,768 B1 | 2/2002 | Proudfoot | |
| 6,387,989 B1 | 5/2002 | Sulzbach et al. | |
| 6,395,156 B1 | 5/2002 | Hsueh et al. | |
| 6,395,647 B1 | 5/2002 | Li et al. | |
| 6,544,858 B1 | 4/2003 | Beekman et al. | |
| 2002/0005347 A1 * | 1/2002 | Sferlazzo et al. | 204/192.1 |
| 2002/0060201 A1 | 5/2002 | Yeom et al. | |
| 2002/0175296 A1 | 11/2002 | Kimura et al. | |
| 2002/0185226 A1 | 12/2002 | Lea et al. | |
| 2003/0047536 A1 | 3/2003 | Johnson | |
| 2003/0085122 A1 * | 5/2003 | Takahashi | 204/298.23 |
| 2003/0157781 A1 | 8/2003 | Macneil et al. | |
| 2003/0227258 A1 | 12/2003 | Strang et al. | |
| 2004/0023125 A1 | 2/2004 | Nozawa et al. | |
| 2004/0084299 A1 | 5/2004 | Slaughter | |
| 2004/0212288 A1 | 10/2004 | Kanarov et al. | |
| 2004/0216992 A1 * | 11/2004 | Ando et al. | 204/192.12 |
| 2005/0115822 A1 * | 6/2005 | Maass et al. | 204/192.2 |
| 2005/0159010 A1 | 7/2005 | Bhardwaj et al. | |
| 2005/0194097 A1 | 9/2005 | Uchiyama | |
| 2005/0241767 A1 | 11/2005 | Ferris et al. | |
| 2006/0006064 A1 * | 1/2006 | Tepman | 204/298.12 |
| 2006/0019039 A1 | 1/2006 | Hanawa et al. | |
| 2006/0060795 A1 | 3/2006 | Takeuchi et al. | |
| 2006/0137969 A1 * | 6/2006 | Feldewerth et al. | 204/192.15 |
| 2010/0181706 A1 * | 7/2010 | Ruuttu et al. | 204/298.12 |

FOREIGN PATENT DOCUMENTS

| | | |
|---|---|---|
| EP | 0 532 283 | 3/1993 |
| GB | 1057119 | 2/1967 |
| GB | 1138212 | 12/1968 |
| GB | 1295465 | 11/1972 |
| GB | 2 295 485 A | 5/1996 |
| GB | 2 327 909 | 2/1999 |
| GB | 2 364 434 | 1/2002 |
| JP | 58-189952 | 11/1983 |
| JP | 63-195264 | 8/1988 |
| JP | 02-097673 | 4/1990 |
| JP | 03-075300 | 3/1991 |
| JP | 04-006272 | 1/1992 |
| JP | 04006272 A * | 1/1992 |
| JP | 4-194372 A | 7/1992 |
| JP | 5-74361 A | 3/1993 |
| JP | 5-232299 | 9/1993 |
| JP | 5-271925 | 10/1993 |
| JP | 7-169426 | 7/1995 |
| JP | 7-230987 | 8/1995 |
| JP | 8-139024 | 5/1996 |
| JP | 08 335447 | 12/1996 |
| JP | 2000-73165 | 3/2000 |
| JP | 2000-178731 | 6/2000 |
| JP | 2001 20068 | 1/2001 |
| JP | 2003-17472 | 1/2003 |
| JP | 2004-62135 | 2/2004 |
| WO | WO 98/14977 A1 | 4/1998 |
| WO | WO 98/18150 A1 | 4/1998 |
| WO | WO 00/36631 A1 | 6/2000 |
| WO | WO 01/22470 A1 | 3/2001 |
| WO | WO 02/33725 A2 | 4/2002 |
| WO | WO 02/097850 A2 | 12/2002 |
| WO | WO 2005/024881 A2 | 3/2005 |
| WO | WO 2008/009892 A1 | 1/2008 |

OTHER PUBLICATIONS

Spaepen, F. et al., "Ion Beam Sputtering Apparatus for Fabrication of Compositionally Modulated Materials," Review of Scientific Instruments, AIP, Melville, NY, US, vol. 56, No. 7, Jul. 1985, pp. 1340-1343.

International Search Report and Written Opinion for PCT/GB2007/002550 dated Oct. 12, 2007, 13 pages.

International Search Report and Written Opinion for PCT/GB2007/002614 dated Nov. 2, 2007, 13 pages.

International Search Report for PCT/GB2007/002537 dated Dec. 14, 2007, 5 pages.

Great Britain Search Report for GB0614500.7 dated Nov. 29, 2006, 1 pg. claims searched all.

Great Britain Search Report for GB0614501.5 dated Nov. 29, 2006, claims searched 1-15.

Great Britain Search Report for GB0614501.5 dated Jun. 1, 2007, 1 page, claims searched 16 to 18.

Great Britain Search Report for GB0614501.5 dated Jun. 1, 2007, 1 page, claim searched 19.

Great Britain Search Report for GB0614499.2 dated Jul. 2, 2007, 1 pg, claims searched 6-31.

* cited by examiner

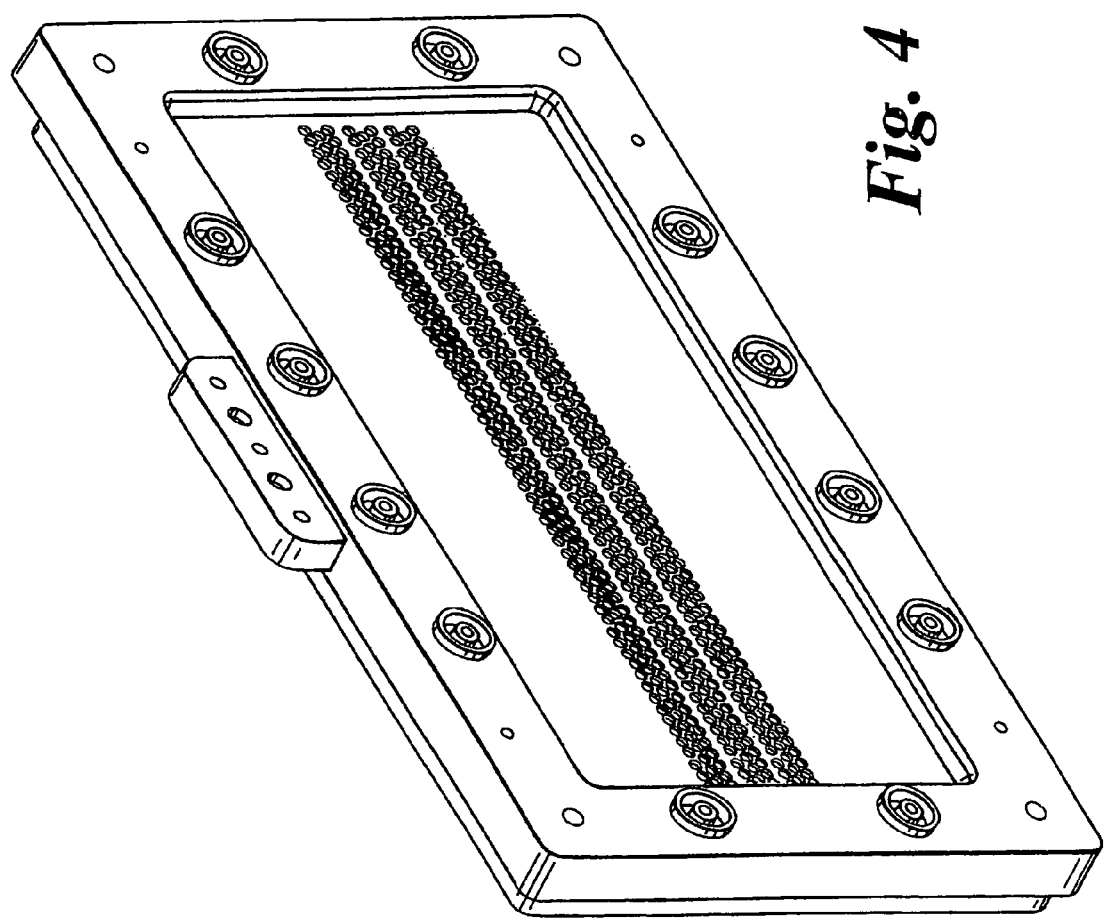

# ION DEPOSITION APPARATUS HAVING ROTATABLE CAROUSEL FOR SUPPORTING A PLURALITY OF TARGETS

CROSS REFERENCE TO RELATED APPLICATIONS

This Application is a United States National Stage Application filed under 35 U.S.C. §371 of PCT Patent Application Serial No. PCT/GB2007/002537 filed on Jul. 6, 2007, which claims the benefit of and priority to Great Britain (GB) Patent Application Serial No. 0614499.2 filed on Jul. 21, 2006 and U.S. Provisional Patent Application Ser. No. 60/832,474 filed on Jul. 20, 2006, the disclosures of both of which are hereby incorporated by reference in their entirety.

BACKGROUND OF THE INVENTION

This invention relates to broad ion beam deposition (BIBD) apparatus and uses thereof. It is known to provide BIBD apparatus having an ion source, which feeds an ion beam through parallel grids to form a collimated beam that projects on a target to sputter material onto a substrate. Typically the target is deposed at about 45° to the main axis of the beam and the resultant sputtering occurs in a fairly wide arc with the relatively high degree of non uniformity. The ion beams so produced are generally circular in cross section and so either quite a lot of the target is not utilised or some of the beam will tend to pass by the edges of the target with the result that stray materials may be sputtered. Either way the efficiency is poor and so for the most part ion beam deposition has been a research tool or used in the manufacture of component parts where very specific film properties are essential and can only be achieved by this technique. This is because to date throughput has been very low and so only high value goods can bear the cost of such an operation.

It is known to have more than one target of different materials, mounted on a carousel in the form, for example, of a hexagon, to enable successive depositions but this tends to mean that the beam area at the target has to be further reduced to avoid stray impacts on the preceding and succeeding targets.

BRIEF SUMMARY OF THE INVENTION

From one aspect the invention consisting a broad ion beam deposition apparatus including:
(a) an ion source for producing an ion beam; and
(b) a rotatable target support for successfully aligning targets with the beam characterised in that the targets are generally rectangular and the ion source is arranged to produce a beam which is rectangular in cross section:

From another aspect the apparatus consists in the broad ion beam deposition apparatus including an ion source for producing an ion beam and a rotatable target support defining a plurality of target locations characterised in that the first location lies in the position which is, in use, in the shadow of a beam impinging on its succeeding location.

Preferably the target locations are spaced and inclined to the respective face of a notional regular geometric figure having a number of faces equal to the number of locations. For example, there may be eight locations.

From a further aspect the invention includes ion beam deposition apparatus including an ion source for producing an ion beam along a path, a target location in the path, a support for a substrate to one side of the path and an auxiliary process port to the other side of the path.

In many of the cases the ion source may include a chamber for containing a plasma and having an outlet for ions; and an accelerator mounted at the outlet for drawing a stream of ions from the plasma and forming them into a beam, in a direction, wherein the accelerator includes four spaced generally parallel grids, the second to fourth grids numbered in the direction being located by two sets of supports wherein one set supports the second and fourth grids and the other set supports the third grid.

The second grid does not need to be supported on the first grid, but instead its support can pass through an aperture of the first grid to engage the chamber wall or an extension thereof and indeed can sit in a recess in such a wall or extension. The insulator length can therefore be significantly extended. Similarly the support for the third grid can pass through the first grid.

In a preferred embodiment at least one of the supports of the first set includes an insulator extending from the second grid to the fourth grid and additionally or alternatively at least one of the supports of the second grid includes an insulator extending from a wall of the chamber which defines the outlet, or an extension thereof, to the third grid. Optionally, at least one of the supports of the other set may include an insulator extending from the third grid to the fourth grid. It is particularly preferred that the above mentioned insulators are present on all respective supports.

It is also preferred that at least some of the insulators include formations, which will create sputter shadows to prevent reverse sputtering creating a conductive path over the full length of the insulator. Such formations can also be formed in such a way as to increase the tracking length on the surface of the insulator.

In any of the above cases the first grid may be mechanically pre-stressed to present a concave or convex profile in the direction about one axis. The applicants have appreciated that the mechanical pre-stressing enables a precise design configuration to be achieved, which will not distort under heat, but which does not require expensive preheat treatments. As the pre-stressing is in one dimension it can be machined into the chamber wall or other component against which the first grid may be clamped, thus avoid expensive heat treatment. They further appreciated that, contrary to what is taught in 6346768, that a convex curve is desirable, because this will to some extent address plasma non-uniformity or allows the possibility of the plasma density being matched to a particular design configuration, because when pre-stressed the first grid will stay where it is designed to be. The concave profile can be used to provide a 'hollow' beam.

The grid is generally rectangular and the axis is the longitudinal axis.

At least some of the openings in a grid adjacent its periphery may be smaller in cross-section than those located in a central region. It had previously been thought that the outer holes or openings should be bigger to increase the current flow adjacent the walls of the plasma chamber, where the plasma density is reduced. The inventors have appreciated that, surprisingly, this is the wrong approach and their proposal will give a beam with reduced divergence. In general the cross-section of the openings may be proportional to the anticipated local plasma density. The source may include a plurality of plasma generators, which when the source is rectangular or elongate can be spaced along its length.

The ion source may include a plasma generator, a chamber having a volume for the plasma and a body located in the volume for creating local losses and thereby reducing local plasma density to determine the gradient of the plasma density across the volume.

In a preferred arrangement the plasma density is made more uniform across the chamber.

The Applicants have realised that there is, surprisingly, a completely different approach to the problem of plasma uniformity or achieving a preferred plasma gradient, which is to reduce the higher plasma density, which typically occurs towards the centre of the plasma, so that the density across the whole plasma is significantly more uniform or graduated as required. This can be used in combination with the traditional magnetic approach or alternatively it can be used alone.

Conveniently the body is generally planar and may lie in a general lateral plane in the chamber. The body may have one or more cut-outs or openings and indeed there may be more than one body. The bodies may be co-planar or alternatively they may be spaced and generally parallel.

In an alternative arrangement the body may be arranged generally axially within the chamber and there may be a number of spaced parallel bodies.

Where the body is located in an RF field it should be formed from an insulator. Otherwise the body may be a conductor. The body may be any suitable shape, but for manufacturing reasons a regular geometrical shape such as triangular, circular, diamond shaped, square or rectangular bodies are particularly suitable. Three dimensional and/or irregular shapes may be used.

The plasma source may be part of an ion source. Equally it may be substituted for antennae configurations or other plasma sources. Any appropriate mode of generating plasma may be used.

From a further aspect the invention consists in an ion source for creating a low power ion beam of 100V or less including a plasma generator having an input power of above about 100 W, a plasma chamber and at least a body located in the plasma chamber for absorbing power from a plasma contained in the chamber.

In this arrangement, the problems associated with running ion sources with very low input powers to created lower power beams can be overcome by running the source at higher powers and then using the body to absorb sufficient power to reduce the ion beam to the desired level.

Although the invention has been defined above it is to be understood that it includes any inventive combination of the features set out above or in the following description.

BRIEF DESCRIPTION OF THE SEVERAL VIEWS OF THE DRAWING

The invention may be performed in various ways and specific embodiments will now be described, by way of example, with reference to the accompanying drawings in which:

FIG. 4 is a view from the front and one side of a grid assembly for use with the ion gun of FIG. 2;

DETAILED DESCRIPTION OF THE INVENTION

Figure 1:
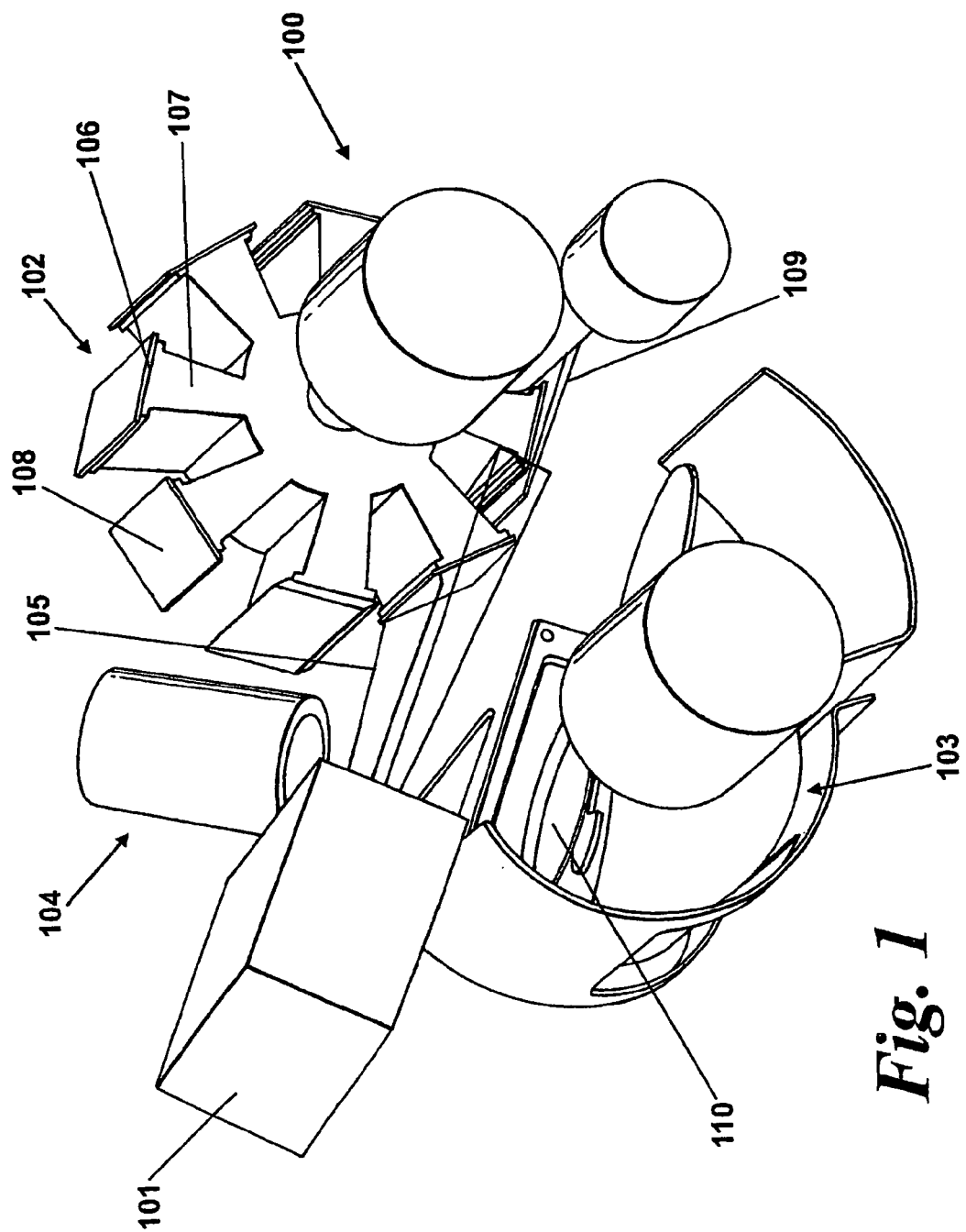
FIG. 1 is a schematic view of ion deposition apparatus.

Referring to FIG. 1 broad ion beam deposition apparatus, generally indicated at 100 includes an ion source 101, a target carousel 102, a tiltable substrate table 103 and an auxiliary port 104.

As will be described in more detail below, the ion source 101 produces a substantially rectangular section beam 105 which is directed towards the target carousel 102. The target carousel (support) carries a number of targets, for example eight, on tables (target holders) 106 on spaced generally radial legs 107. In fact the legs 107 and tables 106 are slightly offset so that the target locations defined by the tables 106 are inclined to the faces, respectively, of a notional regular geometric figure (i.e., a regular polygon) having a number of faces (sides) equal to the number of locations and centred on the axis of rotation of the carousel 102. It will be noted that the targets 108 are rectangular. Thus, in this example, in any given position of the target carousel 102, the eight sides of a regular octagon intersect and pass through the target locations (tables 106 and/or targets 108), respectively, but each target location (table 106 and/or target 108) is inclined or skewed, front to back in the direction of rotation of the carousel 102, relative to the side of the regular octagon passing therethrough such that the generally planar rectangular target 108 supported by the table 106 is similarly inclined.

The combination of the rectangular section beam 105 and the inclined rectangular target 108 not only means that sputtering takes place substantially across the target, but also, as can be seen in FIG. 1, the preceding target, to that which is active at any time lies within the shadow with respect to the beam and hence no undesirable sputtering will take place. Further it is possible to introduce the target shielding indicated at 109 to protect the preceding target. It will be noted that that shielding is essentially wedge-shaped and may optionally be actuated so that its leading edge lies as close as possible to the face of the protected target.

The spaces 107a between the legs have a relatively high aspect ratio whereby any beam overspill on the upstream edge of a target will pass down the space and any resultant sputtered material will be retained within the space.

It will also be noted that the targets are spaced relative to each other and this, particularly with a rectangular beam, enables full-faced target cleaning to occur. Material sputtered from the active target impinges on the substrate 110 which is mounted on the tiltable substrate table 103. It has been determined that the uniformity of sputtered layers on the substrate are very sensitive to the substrate angle, but that the optimum angle is target material dependent. The tiltable table therefore allows precise setting of the apparatus. It will be noted that the auxiliary port 104 is disposed substantially at right angles to the ion beam 105, but faces the tiltable table 103. This allows the possibility, when a sputter step has been performed, of deposition or ion beam processing, for example, for target cleaning to take place in between the sputter steps. The substrate can be tilted to the optimum position for such processing by the tiltable table 103 and then can be tilted back to the optimum position for sputtering. Alternatively an ion source located on the auxiliary port could be utilised during sputtering for the purpose of ion assisted deposition or surface modification. A substrate shield 111 can be located over the substrate or substrate location during cleaning.

It will be understood that the resultant apparatus is extremely flexible as the targets 108 can be made from different materials and, using the auxiliary port 104, other process steps can take place between sputter steps. Thus in the single chamber, a series of fabrication steps can take place.

A particularly preferred ion source arrangement is described in connection with FIGS. 2 to 9 and further embodiments are described in connection with FIGS. 10 to 12.

Figure 2:
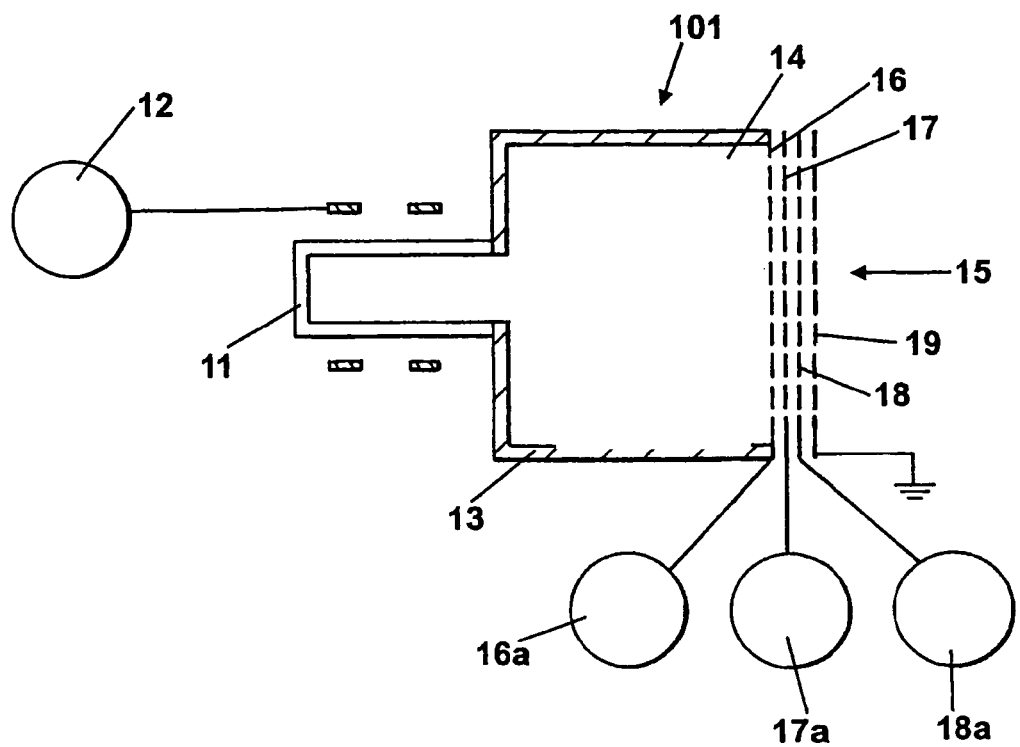
FIG. 2 is a schematic diagram of an ion gun.

An ion gun; 101, is schematically shown in FIG. 2. It comprises a plasma generator 11 driven from an RF source 12, a plasma or source chamber 13, having an outlet 14, across which is mounted an accelerator grid 15. The accelerator grid 15 comprises four individual grids. The first grid 16, which is closest to the outlet 14 is maintained at a positive voltage by DC source 16a, the second grid 17 is maintained strongly negative by DC source 17a. The third grid 18 is maintained at a negative voltage, which is much lower than that of the second grid 17, by DC source 18a and the fourth grid 19 is grounded.

Figure 3:
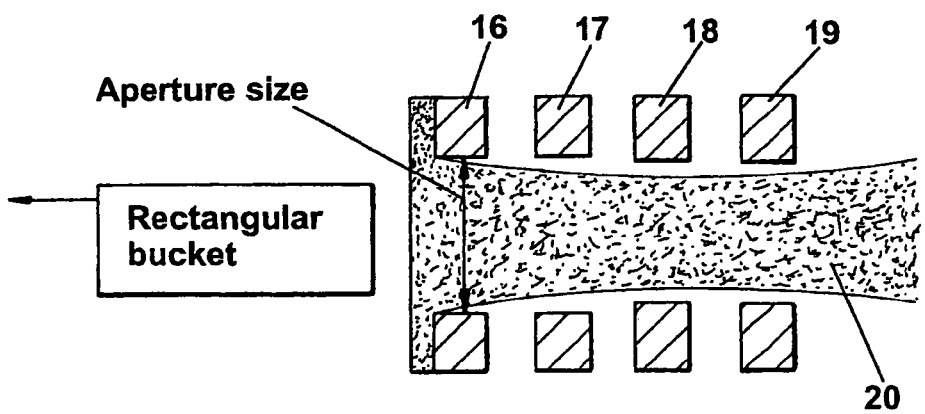
FIG. 3 is a schematic view of the accelerator grid of the gun of FIG. 2 on an enlarged scale.

For reasons highlighted below, the applicants are able to run the second grid 17 at around −2000V or even higher. This has a dual effect of creating a good electric lens, between plates 16 and 17. The result of this is shown in FIG. 3 where the ion beam 20 is focused between plates 16 and 17. The high negative voltage on grid 17 also significantly accelerates the ions in the beam 20 and accordingly reduces the divergence creating effect of the transverse focusing forces over the operational length of throw of the ion beam 20.

Grid 18 is at a much smaller negative voltage allowing the ground voltage of grid 19 to be achieved in two decelerating steps, without causing significant divergence of the beam 20.

The positive, negative, negative, ground arrangement of the grids also significantly reduces the likelihood of a reverse electron current, which could cause voltage collapse and instability.

Figure 6:
FIG. 6 is a cross sectional view of the grid of FIG. 5 along the line A-A with the curvature exaggerated.
Figure 5:
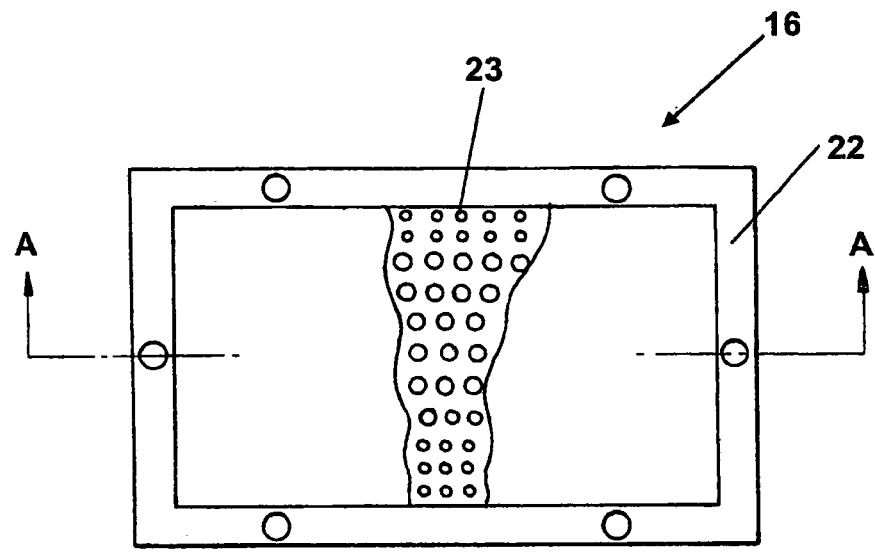
FIG. 5 is a plan view of the first grid for use with an ion gun of FIG. 2.
Figure 7:
FIG. 7 is an end view of the grid of FIG. 5.

FIG. 4 shows a grid assembly. The grids 14 to 19 can be attached to the chamber 13 through frame assembly 21 and are themselves connected to the frame 22 as described below. Turning to FIGS. 5 to 7 it should first be noted that the openings 23 in the grid 16 are smaller nearer the periphery than in the centre, for the reasons previously discussed. Secondly, as shown in FIG. 6 grid 16 is mechanically pre-stressed in a slight longitudinal convex curve, which is exaggerated in the drawing, to overcome the heat effects previously mentioned. Conveniently this curvature, which may hardly be visible, may be machined into the chamber wall against which the first grid is clamped, thus avoiding expensive heat treatments. Alternatively the curve may be concave, which can produce a hollow beam.

It will be noted that in the frame 22 there are openings 23 through which supports pass and in which voltage connections such as indicated in FIG. 4 at 24 may be attached.

Figure 8:
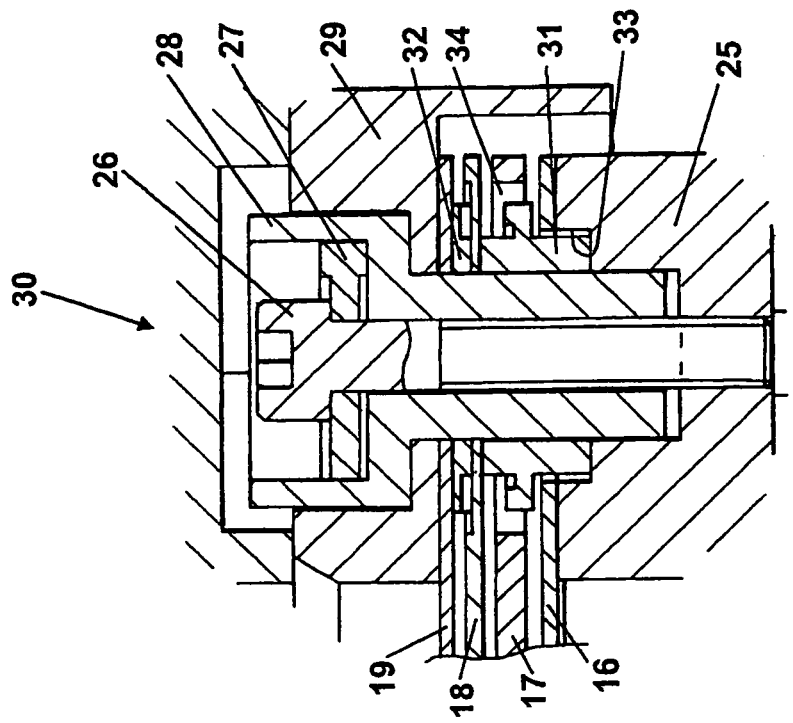
FIG. 8 is a cross sectional view through an accelerator grid showing one of a first set of supports.
Figure 9:
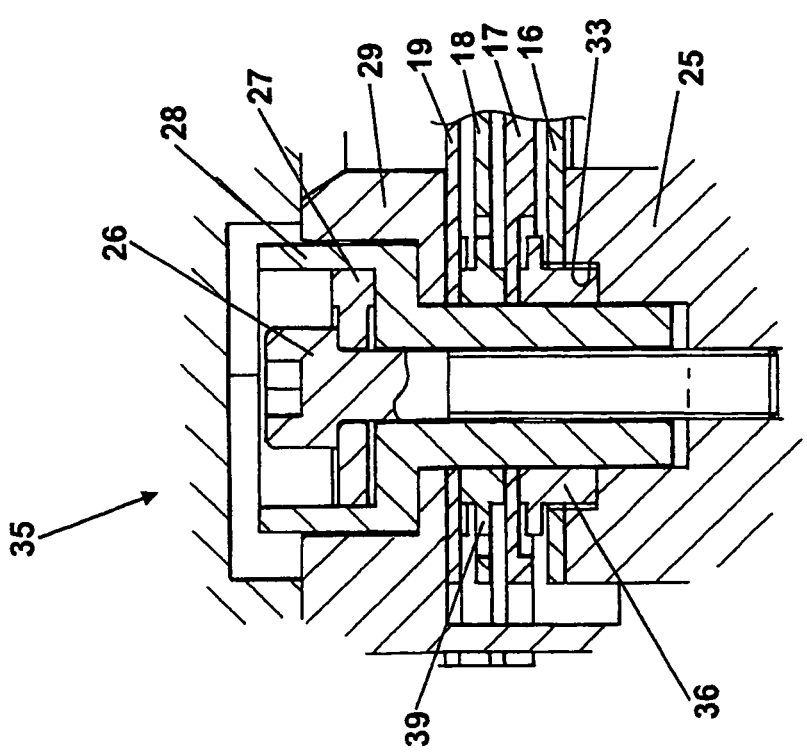
FIG. 9 is a corresponding view to FIG. 8 through one of the second sets of supports.

It is proposed, as can be seen in FIGS. 8 and 9, that two different forms of supports should be used. Each support includes a central core which enables the support to be located in the wall 25 of the source chamber 13. In each case the central core includes a screw 26, a washer 27, a sleeve 28 and a clamp 29, which may be the frame 22. As will be well understood by one skilled in the art, this arrangement can be used to hold the grids 16 to 19 in compression and to thus locate them vertically and laterally subject to interconnections between them.

One of the supports, which constitutes the first set, as previously mentioned, is illustrated at 30. This further includes two annular insulators 31 and 32. It will be seen that the insulator 31 is able to pass through the grid 16 to sit in a recess 33 in the wall 25. It then passes upwardly through an opening 34 in the second grid 17 to support the third grid 18. The insulator 32 in turn sits on the grid 18 to support the grid 19. This effectively decouples the second grid from the third grid in mechanical terms whilst providing a long insulator 33 between the chamber 25 and the third grid 18.

A member of the second set of supports is illustrated in FIG. 9 at 35. Here the lower annular insulator 36 supports the second grid 17 and the upper annular insulator 37 in turn supports the fourth grid 19. In this way both the second and third grid as dimensionally referenced to the wall 25 and the fourth grid 19, but without being engaged with each other. This enables the insulator 36 to pass through the first grid 16, rather than sitting on it so that the advantage of the recess 33 can once more be gained and it also allows for the convex curve to be introduced into the grid 16 without losing accuracy in the positioning of the remaining grids.

Figure 10:
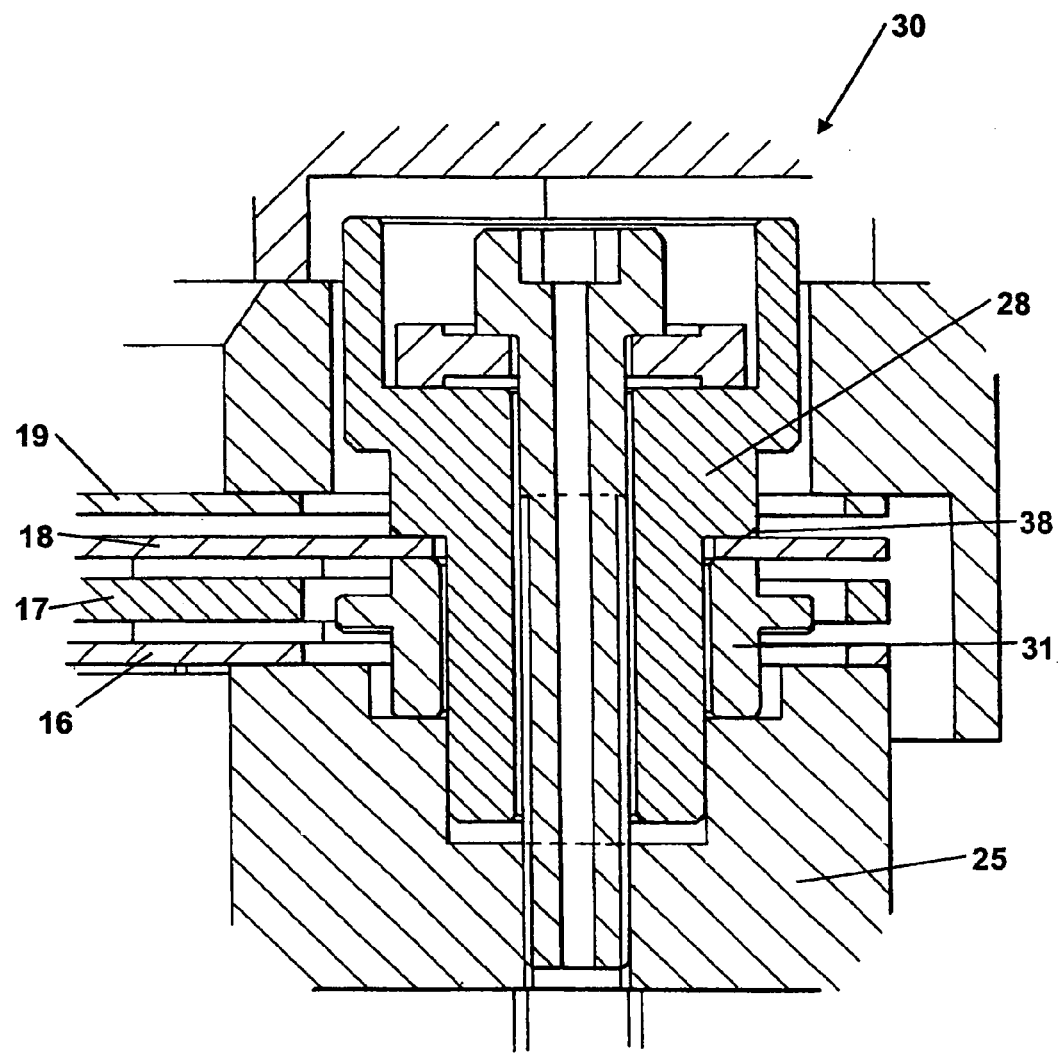
FIGS. 10 and 11 correspond to FIGS. 8 and 9 respectively for an alternative embodiment.
Figure 11:
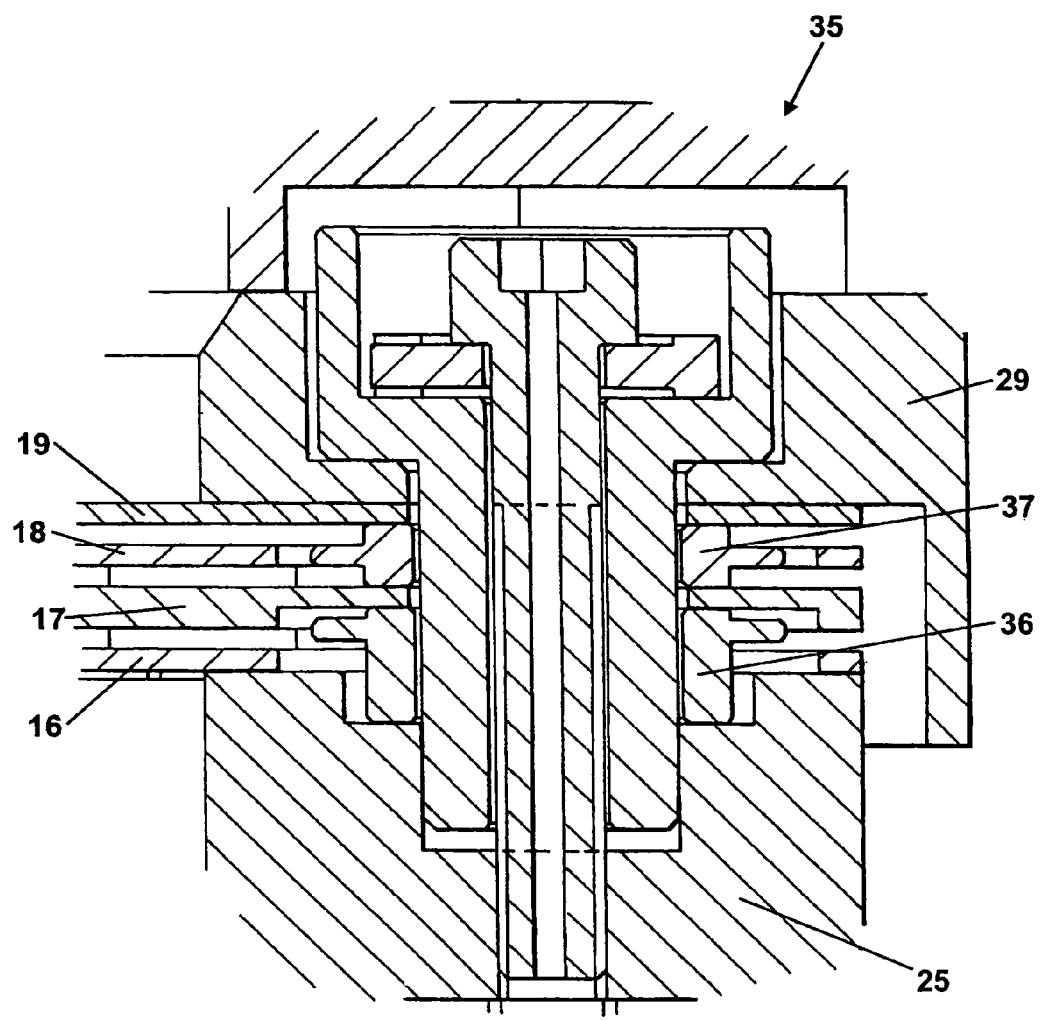

FIGS. 10 and 11 illustrate an alternative arrangement in which the fourth grid 19 is not supported on the third grid 18 and the sleeve 28 is provided with a shoulder 38 to clamp the third grid 18.

The grids 16 to 19 are described as generally parallel despite the curvature of the grid 16. As that grid is generally planar in configuration the phrase will be well understood by those skilled in the art.

Figure 12:
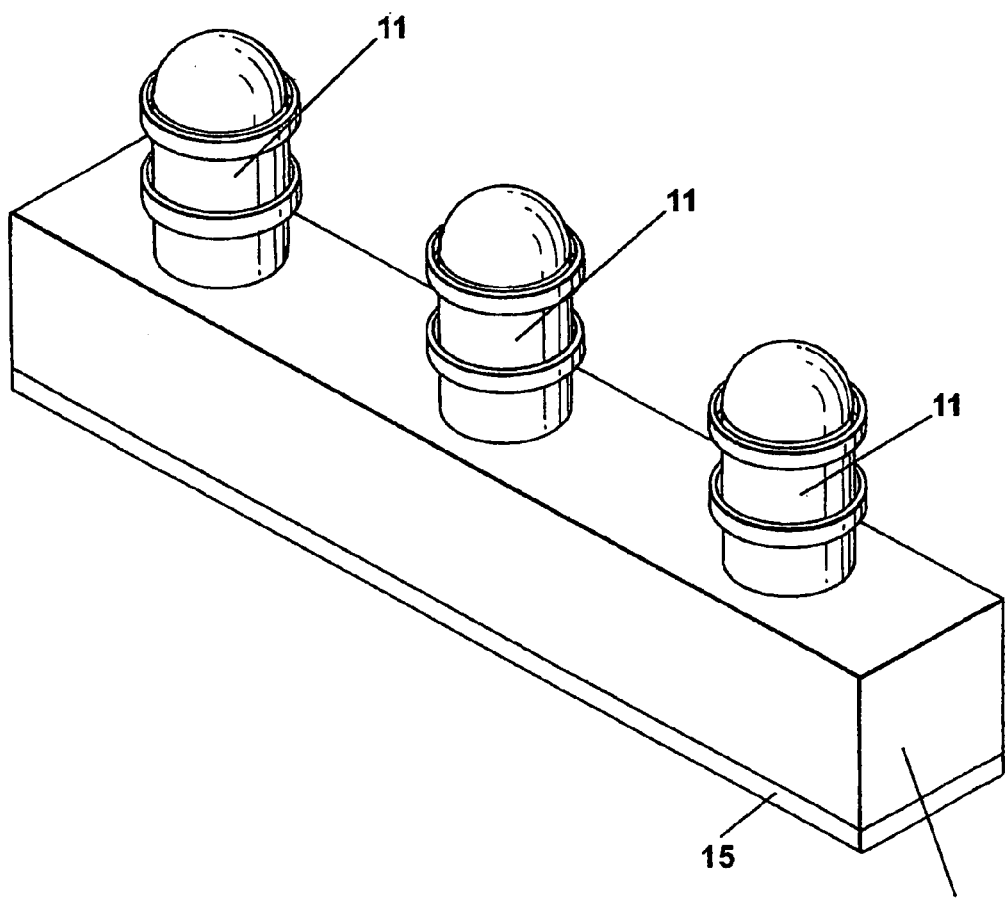
FIG. 12 is a schematic view of a multi-antennae source.
Figure 13:
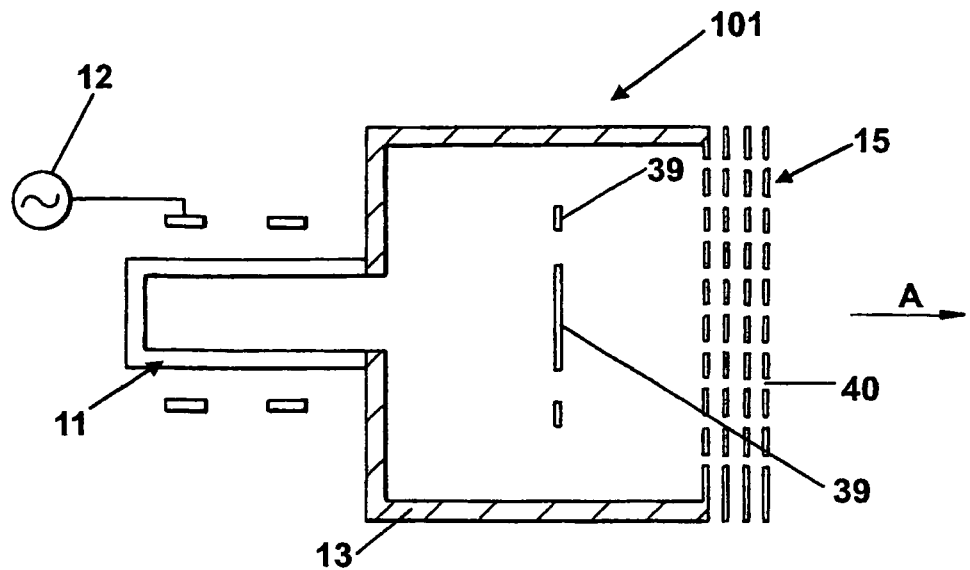
FIG. 13 is a schematic cross section through a first embodiment of an ion source.
Figure 14:
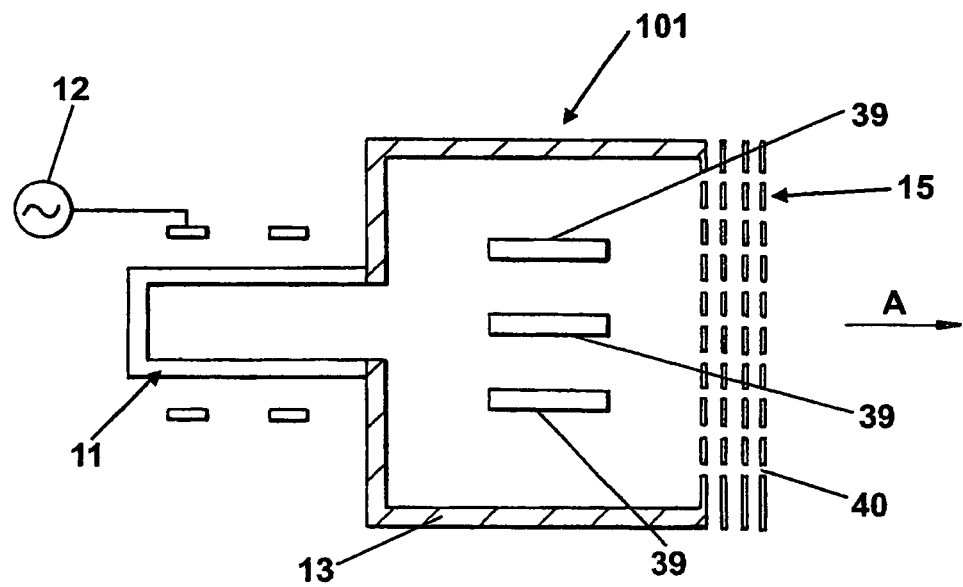
FIG. 14 is a corresponding view through an alternative construction.

In FIG. 12 a single large (e.g. 150 mm×900 mm) chamber 13 is supplied by three plasma generators 11. As illustrated the generators 11 are MORI® sources supplied by Aviza Technology Inc., but any suitable generator may be used. The accelerator grid is shown at 15. Multiple generator sources of this type can be used for provide broad beam for processing large substrates e.g. flat screen displays.

The Applicants have also developed a surprisingly simple system for adjusting the local plasma density within the ion source so as either to achieve enhanced uniformity across the width of the source or, for some particular processing techniques, to provide a predetermined gradient of plasma density. For example it may be desirable to have an inverted density distribution with the lowest density towards the centre of the source.

The Applicants have inserted a body 39 to extend laterally across a general central portion of the chamber 13. The size, shape and location of the body 39 are selected to absorb the sufficient power from the plasma struck in the chamber so as to reduce locally the plasma density in such a way that the density of the plasma, as seen by the grid 15 is essentially uniform across the width of the chamber 14 or to achieve some desired profile of non-uniformity.

The size, shape and location can be determined empirically. The body 39 may be provided with openings or perforations 40 to allow for local fine tuning.

When a lateral body of this type is used, it will also affect the flow of ions through the chamber, as well the presence or absence of opening 40. This can be used to displace ion flow towards the chamber walls again enhancing uniformity. More than one body can be used and the addition of further bodies 39 will often persist in fine tuning.

As has already been mentioned, the ion source is only one example of a plasma generation device and the principles discussed above can equally well be applied to other plasma generation devices.

As well as being used to alter the level of non-uniformity within the plasma, a body or bodies 39 can be used to absorb power from the ion beam. This can be particularly effective for applications where low energy process beams (eg 100V or below) are required. Typically applications requiring low energy process beams demand a plasma density in the region of 0.2 mAcm$^{-2}$, with good uniformity. However this means that they tend to be operated at input powers in the region of 20 W where it is extremely difficult to control the device. In contrast, the Applicants have appreciated, that by utilising the arrangement shown in FIG. 1, the ion source can be operated in a well controlled region e.g. an input power of 150 W. The body or bodies 39 are then designed to absorb sufficient power and provide the appropriate uniformity.

If power absorption or control of plasma density is the sole requirement, then the body or bodies 39 may be aligned longitudinally with in the chamber 14 as illustrated in FIG. 2. Arrangement lying between the orientations of FIGS. 1 and 2 may also be utilised.

The positioning requirements vary depending on the geometry of the apparatus, but in general the insert should not be place too close to the antenna region of primary plasma generation such that it affects the flow of plasma into the chamber 13. Equally if the body 39 is too close to the grid 15 or process plane, it may effectively block the grid 15. Within these limits the longitudinal position of the body may be selected in accordance with the effect that is desired. There is some suggestion from experiment, that the diffusion length of the expansion box is sensitive to changes of the insert axial location of the order of 5 mm. A diffusion length of half the radius of the insert, measured across the short axis of the chamber 13, has proved to be acceptable. In general it has been found that it is useful to have an insert which follows the symmetry of the chamber 13.

The invention claimed is:

1. A broad ion beam deposition apparatus including:
   (a) an ion source that produces an ion beam which has a rectangular cross section and propagates along a path; and
   (b) a target support including a number of target holders spaced from one another about a central axis at locations through which the sides of a regular polygon centered on said axis pass, respectively, such that each side extends perpendicular to a line extending radially from the central axis, and
   wherein the target support is supported in the apparatus so as to be rotatable about said central axis and is positioned relative to the ion source such that the target support can bring targets supported by the target holders, respectively, in succession to a processing position in the path of the beam, and
   each of the target holders is configured to support a rectangular target at an inclination, in a direction front to back with respect to the direction of rotation of the target support, relative to the side of the regular polygon passing through the target holder.

2. Apparatus as claimed in claim 1 wherein the target support is a carousel.

3. Apparatus as claimed in claim 1 wherein the target support has eight target holders.

4. A broad ion beam deposition apparatus including:
   an ion source that produces an ion beam which has a rectangular cross section and propagates along a path;
   a target support including a number of target holders spaced from one another about a central axis at locations through which the sides of a regular polygon centered on said axis pass, respectively; and
   rectangular targets supported by the holders, respectively, about a central axis at locations through which the sides of a regular polygon centered on said axis pass, respectively, such that each of the sides extends perpendicular to a line extending radially from the central axis, and
   wherein the target support is supported in the apparatus so as to be rotatable about said central axis and is positioned relative to the ion source such that the target support can successively bring the targets supported by the target holders, respectively, to a processing position in the path of the ion beam,
   the rectangular cross section of the ion beam at the processing position is at least as large as the area presented to the beam by each of the targets when the target is at the processing position such that the entirety of a rectangular surface of the target at the processing position is impinged by the ion beam and casts a shadow of the ion beam, and
   the target support is positioned relative to the ion source such that another of the targets when in a first position, which is immediately adjacent the processing position, is completely in the shadow of the ion beam impinging on the target at the processing position; and
   wherein each of the targets is disposed at an inclination, in the direction of rotation of the target support, relative to the side of the regular polygon passing through the target holder that supports the target.

5. Apparatus as claimed in claim 4 further comprising a shield positioned to cover a target when the target is at the first position adjacent the processing position.

6. Apparatus as claimed in claim 1 further including a support for a substrate located to one side of the path and an auxiliary port to a side of the path opposite said one side.

7. Apparatus as claimed in claim 6 wherein the support is tiltable for orientating a substrate towards the port or target.

8. Apparatus as claimed in claim 1 wherein the ion source includes a chamber for containing a plasma and having an outlet for ions; and
   an accelerator mounted at the outlet for drawing a stream of ions from the plasma and forming them into a beam, in a direction, wherein the accelerator includes four spaced generally parallel grids, the second to fourth grids numbered in the direction being located by two sets of supports wherein one set supports the second and fourth grids and the other set supports the third grid.

9. Apparatus as claimed in claim 8 wherein the other set supports the third and fourth grids.

10. Apparatus as claimed in claim 8 wherein at least one of the supports in the first set includes an insulator extending from a wall of the chamber which defines the outlet, or an extension thereof, to the second grid.

11. Apparatus as claimed in claim 8 wherein at least one of the supports of the first set includes an insulator extending from the second grid to the fourth grid.

12. Apparatus as claimed in claim 8 wherein at least one support of the second set includes an insulator extending from a wall of the chamber which defines the outlet, or an extension thereof, to the third grid.

13. Apparatus as claimed in claim 8 wherein at least one of the supports of the second set includes an insulator extending from the third grid to the fourth grid.

14. Apparatus as claimed in claim 8 wherein the insulators include a formation for creating a sputter shadow.

15. Apparatus as claimed in claim 8 wherein the chamber wall or the extension thereof includes at least one recess for receiving an insulator.

16. Apparatus as claimed in claim 8 wherein the first grid is pre-stressed to present a convex profile in the direction about at least one axis.

17. A source as claimed in claim 15 wherein the first grid is generally rectangular and the one axis is the longitudinal axis.

18. Apparatus as claimed in claim 8 wherein at least some of the openings in the grid adjacent its periphery are smaller in cross-section than those located in a central area of the grid.

19. Apparatus as claimed in claim 1 wherein the ion source includes a plasma generator, including a chamber having a volume for a plasma and a body located in the volume for creating local losses and thereby reducing local plasma density to determine the gradient of the plasma density across the volume.

20. Apparatus as claimed in claim 19 wherein the body is generally planar.

21. Apparatus as claimed in claim 19 wherein the body lies in a generally lateral plane in the chamber.

22. Apparatus as claimed in claim 19 wherein the body has cut-outs or openings.

23. Apparatus as claimed in claim 19 wherein the body is located generally centrally in the lateral plane of the chamber.

24. Apparatus as claimed in claim 19 wherein the body is an insulator.

25. Apparatus as claimed in claim 19 wherein the body is a conductor.

26. Apparatus as claimed in claim 19 wherein, in use, the plasma generator generates a non-uniform plasma in the chamber and the body is located in the region in which the highest plasma density would be generated absent the body.

27. Apparatus as claimed in claim 19 wherein the body is generally triangular, circular, diamond shaped, square or rectangular.

28. Apparatus as claimed in claim 19 wherein there is more than one body.

29. Apparatus as claimed in claim 25 wherein the bodies are spaced and generally parallel.

30. Apparatus as claimed in claim 1 wherein the rotatable target support defines a plurality of generally radially extending spaces exposed between the target holders, the spaces being dimensioned to capture any material sputtered from a target at the processing position by the ion beam and overspilling an upstream edge of the target with respect to the direction of rotation of the target support.

31. Apparatus as claimed in claim 4 further including a support for a substrate located to one side of the path and an auxiliary port located to a side of the path opposite said one side.

32. Apparatus as claimed in claim 4 wherein the ion source includes a chamber for containing a plasma and having an outlet for ions; and
an accelerator mounted at the outlet for drawing a stream of ions from the plasma and forming them into a beam, in a direction, wherein the accelerator includes four spaced generally parallel grids, the second to fourth grids numbered in the direction being located by two sets of supports wherein one set supports the second and fourth grids and the other set supports the third grid.

33. Apparatus as claimed in 4 wherein the ion source includes a plasma generator, including a chamber having a volume for a plasma and a body located in the volume for creating local losses and thereby reducing local plasma density to determine the gradient of the plasma density across the volume.

34. Apparatus as claimed in 4 wherein the rotatable target support defines a plurality of generally radially extending spaces exposed between the target holders, the spaces being dimensioned to capture any material sputtered from a target at the processing position by the ion beam and overspilling an upstream edge of the target with respect to the direction of rotation of the target support.

35. Apparatus as claimed in claim 1 wherein the ion source produces an ion beam that diverges in a direction away from the source such that the rectangular cross section of the beam increases in area along the path.

36. Apparatus as claimed in claim 2 wherein the target support has a central hub, and a plurality of legs radiating from the hub so as to each have an end proximate the hub and a distal end, and wherein the target holders comprise tables integral with distal ends of the legs, respectively, said tables each having a planar surface inclined relative to the side of the regular polygon passing through the target holder constituted by the table.

37. Apparatus as claimed in claim 4 wherein the ion source produces an ion beam that diverges in a direction away from the source such that the rectangular cross section of the beam increases in area along the path.

* * * * *